United States Patent [19]

Shinoda et al.

[11] Patent Number: 5,383,083
[45] Date of Patent: Jan. 17, 1995

[54] PROTECTIVE APPARATUS FOR POWER TRANSISTOR

[75] Inventors: Ryuichi Shinoda; Jun Honda; Kunihiro Miyata, all of Tokyo, Japan

[73] Assignee: Pioneer Electronic Corporation, Tokyo, Japan

[21] Appl. No.: 905,873

[22] Filed: Jun. 29, 1992

[30] Foreign Application Priority Data

May 19, 1992 [JP] Japan .................................. 4-126185
May 19, 1992 [JP] Japan .................................. 4-126186

[51] Int. Cl.$^6$ ............................................. H02H 5/04
[52] U.S. Cl. ......................................... 361/103; 361/91; 361/98
[58] Field of Search ................ 361/103, 98, 101, 91; 330/207 P

[56] References Cited

U.S. PATENT DOCUMENTS

| | | | |
|---|---|---|---|
| 3,808,545 | 4/1974 | Stanley | 330/298 X |
| 4,330,809 | 5/1982 | Stanley | 361/103 |
| 4,355,341 | 10/1982 | Kaplan | 361/79 |
| 4,355,344 | 10/1982 | Felici | 361/103 |
| 4,611,180 | 10/1986 | Stanley | 330/298 |
| 4,787,007 | 11/1988 | Matsumura | 361/98 |

FOREIGN PATENT DOCUMENTS

| | | | |
|---|---|---|---|
| 0058005 | 8/1982 | European Pat. Off. | H03F 1/52 |
| 0142177 | 5/1985 | European Pat. Off. | H03F 1/52 |
| 2656466 | 6/1978 | Germany | H02H 7/20 |
| 2705583 | 8/1978 | Germany | H02H 7/20 |
| 2930017 | 3/1980 | Germany | H02H 7/20 |
| 60-29005 | 2/1985 | Japan | H03F 1/52 |

Primary Examiner—Marc S. Hoff
Assistant Examiner—S. Jackson
Attorney, Agent, or Firm—Sughrue, Mion, Zinn, Macpeak & Seas

[57] ABSTRACT

A protective apparatus for a power transistor which detects an abnormal temperature of a power transistor and cuts a load to the power transistor to prevent possible breakdown of the power transistor. The protective apparatus comprises detecting means which detects a junction temperature of the power transistor on the real time basis from a base-emitter voltage of the power transistor. When the junction temperature of the power transistor is excessively high, a protective circuit produces an output signal, and a muting circuit applies muting to an input signal to or a current flow through the power transistor.

18 Claims, 12 Drawing Sheets

F I G. 1
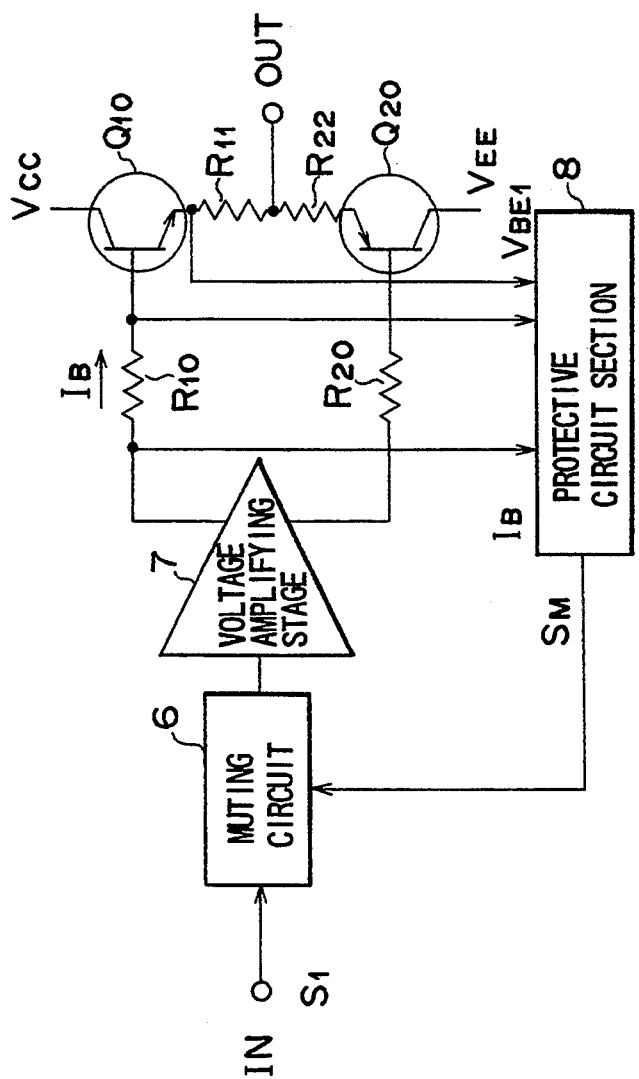

PROTECTIVE APPARATUS FOR POWER TRANSISTOR

BACKGROUND OF THE INVENTION

This application claims the priority of Japanese Patent Applications No. 4-126185 and No. 4-126186 both filed May 19, 1992, which is incorporated herein by reference.

1. Field of the Invention

This invention relates to a protective apparatus for a power transistor for use with an audio frequency (low frequency) power amplifier circuit suitably applied, for example, for driving a loudspeaker for commercial use.

2. Description of the Prior Art

A protective apparatus for a power transistor is commonly employed in an audio frequency power amplifier circuit for driving a loudspeaker and prevents a power transistor from being broken down by an overload condition. An exemplary one of audio frequency amplifier circuits which include such protective apparatus for a power transistor is shown in FIG. 14. Referring to FIG. 14, the audio frequency amplifier circuit is generally denoted at 1 and includes a pair of power transistors $Q_1$ and $Q_2$. A series circuit of resistors $R_1$ and $R_2$ and a further resistor $R_3$ are connected to the emitter of the power transistor $Q_1$, and the base of a further transistor $Q_1$ is connected to a connecting point between the resistors $R_1$ and $R_2$. The collector of the transistor $Q_3$ is connected to the base of the power transistor $Q_1$. When a signal having a great amplitude is applied to the base of the power transistor $Q_1$, the voltage across the resistor $R_2$ rises so that the transistor $Q_3$ is put into an operative condition. Since part of base current of the power transistor $Q_1$ is drawn into the transistor $Q_3$, the base current of the power transistor $Q_1$ is restricted so that the power transistor $Q_1$ is released from an overload condition, thereby preventing junction breakdown of the power transistor $Q_1$ by thermal runaway.

A series circuit of resistors $R_4$ and $R_5$ and a diode $D_1$ are connected to the emitter of the power transistor $Q_1$, and the base of another transistor $Q_5$ is connected to a connecting point between the resistors $R_4$ and $R_5$ and the collector of the transistor $Q_5$ is connected to a relay driving circuit 3, thereby constituting a short-circuiting detecting circuit. If short-circuiting takes place between an output of the audio frequency amplifier circuit 1 and the ground, then the transistor $Q_5$ drives the relay driving circuit 5 to open a relay contact 4, thereby to cut the load to prevent excessive current from flowing through the power transistor $Q_1$.

Further in order to protect the power transistors $Q_1$ and $Q_2$ from junction breakdown caused by abnormal heat generation from them arising from short-circuiting or reception of excessively high power, a thermistor 2 is attached to a heat sink or a casing on which the power transistors $Q_1$ and $Q_2$ are mounted. The thermistor 2 detects an abnormal temperature and drives the relay driving circuit 3 to open the relay contact 4, thereby to cut the audio frequency power amplifier circuit 1 from the load to prevent excessively high current from flowing through the power transistor $Q_1$ to protect the power transistor $Q_1$ from junction breakdown caused by thermal runaway.

If circuit constants of components of the protective apparatus for a power transistor such as a limiter circuit or a short-circuiting detecting circuit are set so that output power very near to a maximum rated power may be obtained, then operation of the protective apparatus may sometimes be delayed because of a delay in conduction of heat to the power transistor or the head sink and the protective apparatus may not function adequately. In such a case, an excessive load may be applied to the power transistor beyond its maximum collector loss Pcmax to cause breakdown of the junction of the power transistor. Further, since the protective apparatus is provided on the output stage of the audio frequency power amplifier circuit, the operation of the protective apparatus may be displaced from the phase of an output of the audio frequency power amplifier circuit so that unexpected muting may be applied, resulting in failure to obtain sufficiently high output power. On the other hand, if circuit constants are set such that the protective apparatus may be driven with an excessively high safety factor, then sufficiently high power cannot be obtained.

When the protective apparatus does not operate sufficiently and consequently the power transistor generates heat abnormally, conventionally a muting operation of the power transistor becomes effective only when the thermistor 2 operates after the heat sink is heated. In other words, there is a delay time by a thermal time constant until muting becomes effective, and for the delay time, the power transistor $Q_1$ or $Q_2$ may thermally run away to cause breakdown.

Further, in the case of an audio frequency power amplifier circuit for driving a loudspeaker for commercial use, if sound is interrupted by operation of the protective apparatus, then a suspensive or disagreeable feeling that a failure may have taken place may be given to listeners, customers or the like. Thus, it is required to prevent abnormal heat generation of a power transistor by excessive current without completely cutting an output stage of an audio frequency power amplifier circuit for a comparatively long period of time.

SUMMARY OF THE INVENTION

It is an object of a present invention to provide a protective apparatus for a power transistor which detects an abnormal temperature of a power transistor and cuts a load to the power transistor to prevent possible breakdown of the power transistor.

It is another object of the present invention to provide a protective apparatus for a power transistor which is suitable for use with a loudspeaker for commercial use and prevents such a situation that outputting of sound is interrupted completely by a muting operation for a long period of time.

In order to attain the objects, according to a first aspect of the present invention, there is provided a protective apparatus for a power transistor, which comprises a detecting circuit for detecting a base-emitter voltage of the power transistor, a protective circuit for producing an output signal when an output voltage of the detecting circuit is lower than a predetermined level, and a muting circuit for muting an input signal to the power transistor in response to the output signal of the protective circuit. The muting circuit may alternatively limit a current flow through the power transistor in response to the output signal of the protective circuit.

In the protective apparatus, the detecting means detects a base-emitter voltage of the power transistor. When the thus detected base-emitter voltage is lower than the predetermined level, since this means that a junction temperature of the power transistor is excessively high, the protective circuits produces an output signal to the muting circuit, and consequently, the muting circuits applies muting to the input signal to the power transistor or to the current flow through the power transistor. Thus, since a temperature rise of the power transistor is detected from the base-emitter voltage of the power transistor, the protective apparatus operates on the real time basis, and consequently, the power transistor can be protected from otherwise possible breakdown by thermal runaway.

According to a second aspect of the present invention, there is provided a protective apparatus for a power transistor, which comprises detecting means for detecting a base-emitter voltage of the power transistor, current producing means for producing a current corresponding to a base current to the power transistor, reference means including a transistor to which the output current of the current producing means is supplied, comparing means for comparing an output of the detecting means with an output of the reference means, and limiting means for limiting the base current to the power transistor in response to an output of the comparing means. The limiting means may alternatively limit a current flow through the power transistor in response to an output of the comparing means.

In the protective apparatus, a junction temperature of the power transistor is detected on the real time basis at the comparing means from a base-emitter voltage of the power transistor with reference to another base-emitter voltage of the transistor to which a low base current similar to but much smaller than the base current to the power transistor is supplied. When the comparing means detects that the junction temperature of the power transistor is excessively high, the limiting means limits the base current to the power transistor or the current flow through the power transistor in response to an output of the comparing means. Consequently, muting can be applied immediately to the input signal, that is, the base current to the power transistor or to the current flow through the power transistor with a higher degree of accuracy, and accordingly, the power transistor can be prevented from otherwise possible breakdown which may be caused by thermal runaway.

According to the third aspect of the present invention, there is provided a protective apparatus for a power transistor, which comprises first detecting means for detecting that the base current to the power transistor is equal to a first predetermined value, second detecting means for detecting a base-emitter voltage of the power transistor, third detecting means operable in response to a detection signal from the first detecting means for detecting that a voltage value obtained from the second detecting means is lower than a second predetermined value, and means for controlling an input signal to the power transistor in response to a detection signal from the third detecting means.

In the protective apparatus, when the base current to the power transistor is equal to the first predetermined value, a junction temperature of the power transistor is detected from a base-emitter voltage of the power transistor then. When the base-emitter voltage is lower than the second predetermined value, since this means that the junction temperature of the power transistor is excessively high, muting is applied to the input signal to the power transistor. Thus, the power transistor can be prevented from otherwise possible breakdown caused by thermal runaway.

According to a fourth aspect of the present invention, there is provided a protective apparatus for a power transistor, which comprises a first amplifier circuit for producing an output corresponding to a base current of the power transistor, a first comparator for comparing the output of the first amplifier circuit with a first predetermined reference level, a second amplifier circuit for amplifying a base-emitter voltage of the power transistor, a second comparator for comparing an output of the amplifier circuit with a second predetermined reference level, an abnormal temperature detecting circuit for producing an abnormal temperature detection signal from outputs of the first and second comparators, controlling means for controlling an input signal to the power transistor in response to the abnormal temperature detection signal from the abnormal temperature detecting circuit.

In the protective apparatus, when the base current to the power transistor is equal to the first predetermined reference level, a junction temperature of the power transistor is detected from a base-emitter voltage of the power transistor then. When the base-emitter voltage is lower than the second predetermined reference level, since this means that the junction temperature of the power transistor is excessively high, muting is applied to the input signal to the power transistor. Thus, the power transistor can be prevented from otherwise possible breakdown caused by thermal runaway.

With any of the protective apparatus according to the present invention, a muting operation does not continue for a long period of time, but since a base-emitter voltage of the power transistor is detected to directly measure a junction temperature of the power transistor on the real time basis, a muting operation can be performed intermittently to control generation of heat from the power amplifier. Accordingly, when the power transistor is used, for example, for an output stage of an audio frequency power amplifier circuit for driving a loudspeaker, output sound from the loudspeaker will not be interrupted completely, and consequently, a listener will not have such a suspensive or disagreeable feeling that the audio system may have failed. Accordingly, the protective apparatus for a power transistor can be applied suitably to an audio frequency amplifier circuit for driving a loudspeaker for commercial use.

The above and other objects, features and advantages of the present invention will become apparent from the following description and the appended claims, taken in conjunction with the accompanying drawings in which like parts or elements are denoted by like reference characters.

BRIEF DESCRIPTION OF THE DRAWINGS

FIG. 1 is a block diagram of a protective apparatus for a power transistor showing a first preferred embodiment of the present invention;

DESCRIPTION OF THE PREFERRED EMBODIMENTS

Referring first to FIG. 1, there is shown a protective apparatus for a power transistor to which the present invention is directed. The protective apparatus shown includes a pair of power transistors $Q_{10}$ and $Q_{20}$, a pair of base resistors $R_{10}$ and $R_{20}$, a pair of emitter resistors $R_{11}$ and $R_{21}$, a muting circuit 6, a power amplifying stage 7, and a protective circuit section 8. An output of the power transistor $Q_{10}$ is extracted from a connecting point between the resistors $R_{11}$ and $R_{21}$. A connecting point between the base of the power transistor $Q_{10}$ and the resistor $R_{10}$ and the emitter of the power transistor $Q_{10}$ as well as the other end of the resistor $R_{10}$ are individually connected to the protective circuit section 8, which is in turn connected to the muting circuit 6. The protective circuit section 8 thus detects a base-emitter voltage $V_{BE1}$ of the power transistor $Q_{10}$ and detects a base current $I_B$, which flows through the base resistor $R_{10}$ in response to an input signal $S_1$, from a voltage across the resistor $R_{10}$. Then, when the protective circuit section 8 detects that the base current $I_B$ has a predetermined current value and the base-emitter voltage $V_{BE1}$ has a predetermined value, it delivers a muting signal $S_M$ to the muting circuit 6. In accordance with the muting signal $S_m$, signal routes to the power transistor $Q_{10}$ and $Q_{20}$ are cut or the bias voltages or the collector currents to the power transistor $Q_{10}$ and $Q_{20}$ are controlled.

A principle of operation of the protective apparatus for a power transistor shown in FIG. 1 will be described subsequently. The base-emitter voltage $V_{BE1}$ of the power transistor $Q_{10}$ has a negative temperature characteristic ($-2$ mV/° C.), and a junction temperature Tj of the power transistor $Q_{10}$ is calculated by detecting a particular base current value, detecting the base-emitter voltage $V_{BE1}$ when the particular base current value is detected and performing suitable conversion of the detected base-emitter voltage $V_{BE1}$. When it is detected that the junction temperature Tj of the power transistor $Q_{10}$ is excessively high, muting is applied immediately to the input signal to the power transistors $Q_{10}$ and $Q_{20}$ thereby to prevent junction breakdown of the power transistors $Q_{10}$ and $Q_{20}$ which may otherwise be caused by thermal runaway of them.

Figure 2:
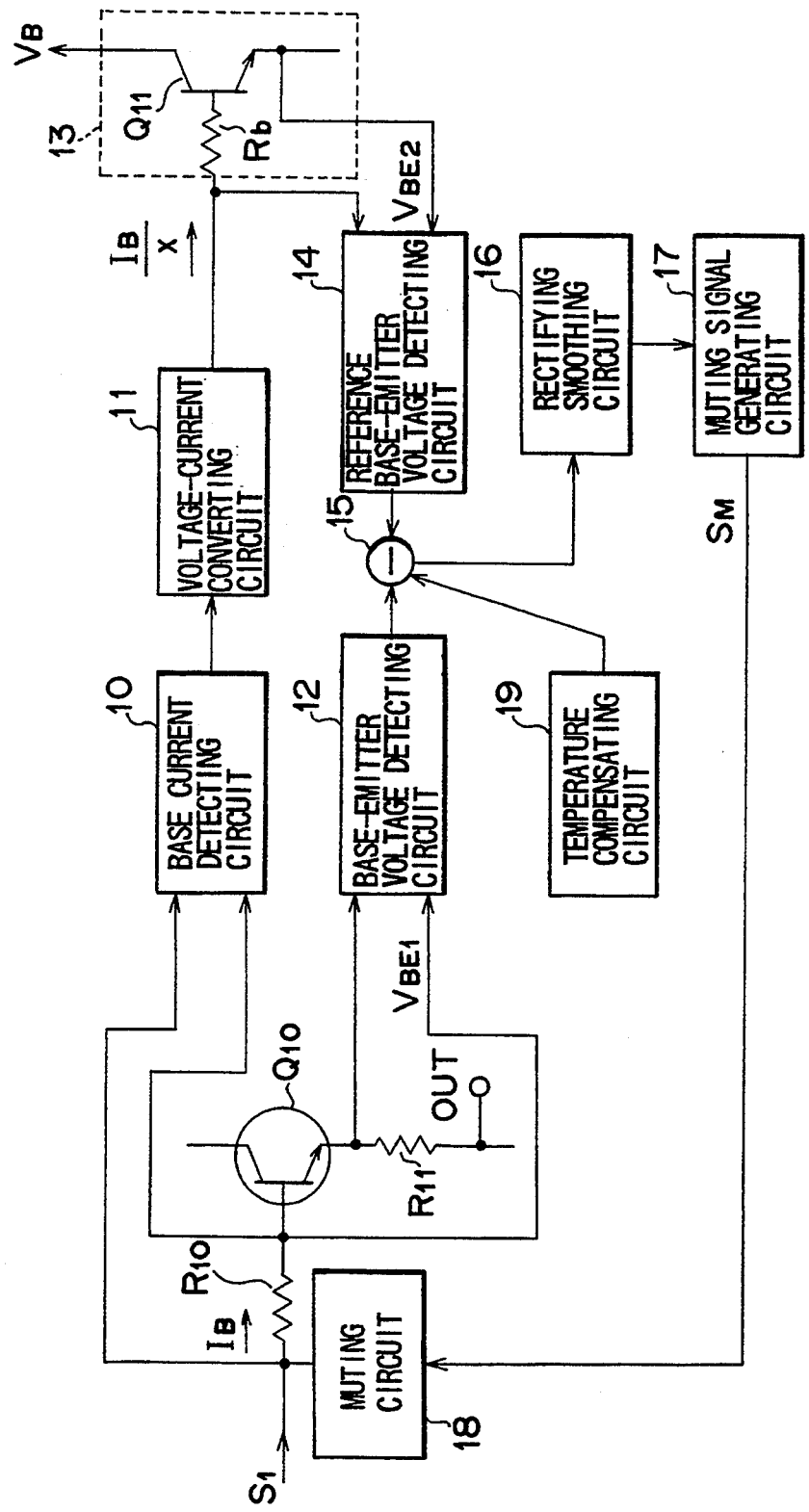
FIG. 2 is a block diagram of another protecting circuit for a power transistor showing a second preferred embodiment of the present invention.

Referring now to FIG. 2, there is shown another protective apparatus for a power transistor according to the present invention. The protective apparatus shown includes a power transistor $Q_{10}$, a base resistor $R_{10}$, an emitter resistor $R_{11}$, a base current detecting circuit 10 for detecting a base current $I_B$ to the power transistor $Q_{10}$ from a voltage across the resistor $R_{10}$, a voltage to current converting circuit 11 for converting an output voltage of the base current detecting circuit 10 into an electric current, a base-emitter voltage detecting circuit 12 for detecting a base-emitter voltage $V_{BE1}$ of the power transistor $Q_{10}$, a reference circuit 13 for defining a reference for detection of a junction temperature of the power transistor $Q_{10}$, a reference base-emitter voltage detecting circuit 14 for detecting a base-emitter voltage $V_{BE2}$ of a transistor $Q_{11}$ provided in the reference circuit 13, a temperature compensating circuit 19 for generating a voltage which increases in proportion to a junction temperature of the reference transistor $Q_{11}$ to compensate for an influence caused by an ambient temperature of the protective circuit network itself, a differential amplifier circuit 15 for detecting a difference between an output voltage of the base-emitter voltage detecting circuit 12 temperature compensated by the temperature compensating circuit 19 and an output voltage of the reference base-emitter voltage detecting circuit 14, a rectifying smoothing circuit 16 for removing pulsations of an error voltage from an output of the differential amplifier circuit 15 and holding temperature data upon cutting off when the power transistor $Q_{10}$ operates in the B class, a muting signal generating circuit 17 for generating a muting signal, and a muting circuit 18 for cutting the input to the power transistor $Q_{10}$. An output of the power transistor $Q_{10}$ is extracted from the other end of the resistor $R_{11}$ remote from the power transistor $Q_{10}$.

In operation, a base current $I_B$ to the power transistor $Q_{10}$ is detected from a voltage across the base resistor $R_{10}$ by the base current detecting circuit 10 which may be constituted from a differential amplifier circuit or the like, and a base-emitter voltage $V_{BE1}$ of the power transistor $Q_{10}$ is detected by the base-emitter voltage detecting circuit 12 which may be constituted from a differential amplifier circuit or the like. The voltage across the base resistor $R_{10}$ detected by the base current detecting circuit 10 is supplied to the voltage to current converting circuit 11, at which it is converted into a current value equal to 1/X times the base current $I_B$ of the power transistor $Q_{10}$. The current value outputted from the voltage to current converting circuit 11 is supplied to the base of the reference transistor $Q_{11}$ by way of a resistor Rb. The resistor Rb is provided so as to obtain a resistance equivalent to an internal base resistance of the power transistor $Q_{10}$. The base-emitter voltage $V_{BE2}$ of the transistor $Q_{11}$ is detected by the reference base-emitter voltage detecting circuit 14. Output voltages of the base-emitter voltage detecting circuit 12 and the reference base-emitter voltage detecting circuit 14 are supplied to the differential amplifier circuit 15. An error voltage for which a variation of the output of the reference circuit 13 caused by an ambient temperature is compensated for by the temperature compensating circuit 19 is outputted from the differential amplifier circuit 15. The error voltage is supplied to the rectifying smoothing circuit 16. An output voltage of the rectifying smoothing circuit 16 is supplied to the muting signal generating circuit 17 which may be constituted from a comparator or the like. When the muting signal generating circuit 17 detects that the error voltage reaches a predetermined level, it delivers a muting signal $S_M$ to activate the muting circuit 18 to apply muting to an output stage of an audio frequency power amplifier circuit or the like, that is, to the input signal $S_1$ to the power transistor $Q_{10}$. Due to such control, even if an excessively high current is supplied to the power transistor $Q_{10}$ by way of the base resistor $R_{10}$, otherwise possible breakdown of the power transistor $Q_{10}$ caused by the current flowing through the power transistor $Q_{10}$ beyond the maximum collector loss Pc of the power transistor $Q_{10}$ is prevented because the current is restricted as a result of such muting.

Figure 3:
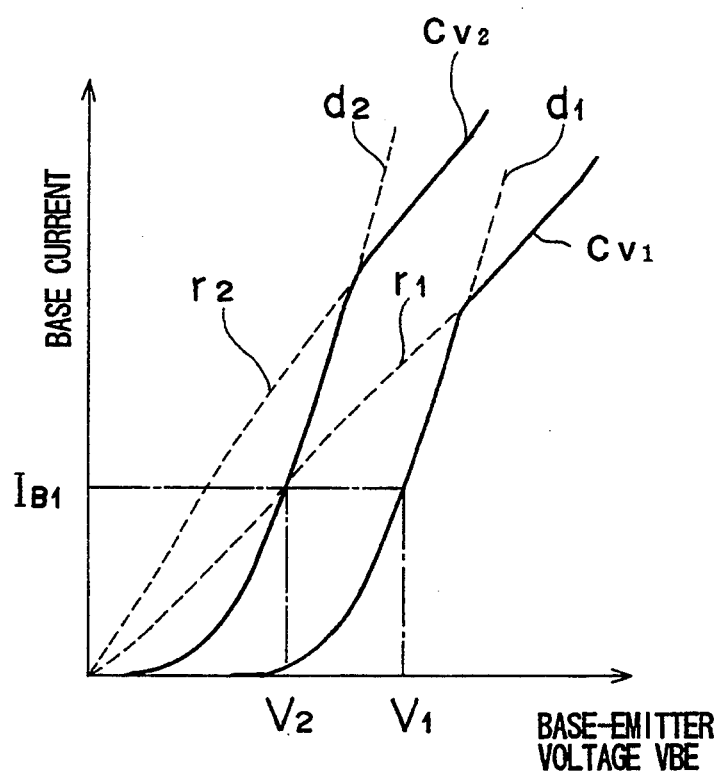
FIG. 3 is a diagram of a voltage - current characteristic illustrating a principle of operation of the protective apparatus for a power transistor shown in FIGS. 1 and 2.

The operation will be described in more detail with reference to FIG. 3. FIG. 8 shows voltage-current characteristics of the base-emitters junctions of the power transistor $Q_{10}$ and the reference transistor $Q_{11}$. A curve $C_{V1}$ shows a voltage-current characteristic obtained by addition of a voltage-current characteristic $d_1$ of the base-emitter junction of the reference transistor $Q_{11}$ and another voltage-current characteristic $r_1$ of the base resistor Rb. Meanwhile, another curve $C_{V2}$ shows a voltage-current characteristic obtained by addition of a voltage-current characteristic $d_2$ of the base-emitter junction of the power transistor $Q_{10}$ and an internal base resistor $r_2$ of the power transistor $Q_{10}$ when the temperature at the junctions of the power transistor $Q_{10}$ rises excessively high. Since the base current $I_B$ is set to a low value and accordingly an influence of the base resistance does not appear clearly, the base resistor Rb is added to the reference side so that the voltage-current characteristic may be similar to the voltage-current characteristic of the power transistor $Q_{10}$ even when the base current $I_B$ is low. Further, the base current of the transistor $Q_{11}$ is set to a current value $I_B/X$ which is smaller than the base current $I_B$ supplied to the power transistor $Q_{10}$ and at which the transistor $Q_{11}$ will not generate heat even if an excessively high current is supplied to the power transistor $Q_{10}$.

Since the base-emitter voltage $V_{BE1}$ of the power transistor $Q_{10}$ has a negative temperature characteristic, if an excessively high current is supplied to the power transistor $Q_{10}$, then the base-emitter junction of the power transistor $Q_{10}$ generates heat so that the base-emitter voltage $V_{BE1}$ of the power transistor $Q_{10}$ drops. On the other hand, since such a low current is supplied to the reference transistor $Q_{11}$ as described above, even if a signal of a great amplitude is inputted to the power transistor $Q_{10}$, the variation of the temperature at the base-emitter junction of the transistor $Q_{11}$ is so small that the base-emitter voltage of the transistor $Q_{11}$ is substantially constant. A base current $I_{B1}$ is supplied as a signal current to the base of the power transistor $Q_{10}$, and thereupon, the base-emitter voltages of the transistors $Q_{10}$ and $Q_{11}$ are detected by the base-emitter voltage detecting circuit 12 and the reference base-emitter voltage detecting circuit 14, respectively. When the base-emitter voltage of the transistor $Q_{11}$ is $V_1$ and the base-emitter voltage of the power transistor $Q_{10}$ is $V_2$, since an influence of an ambient temperature is eliminated by the temperature compensating circuit 19, the difference between the base-emitter voltages, that is, $V_1 - V_2$, is detected by the differential amplifier circuit 15.

Further, since the junction temperature of the power transistor $Q_{10}$ is always detected in order to prepare for application of muting and the voltage-current characteristics $C_{V1}$ and $C_{V2}$ of the power transistor $Q_{10}$ and the reference circuit 13 including the transistor $Q_{11}$ and the base resistor Rb are set similar to each other, even if the operating point of the power transistor $Q_{10}$ is at any position, muting can be applied to the input signal $S_1$ to the power transistor $Q_{10}$ immediately.

Figure 4A:
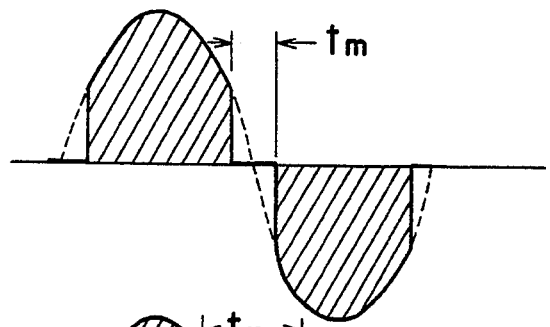
FIG. 4a and 4b is a diagram showing output waveforms of the protective apparatus of FIG. 2 when muting is effective.
Figure 4B:
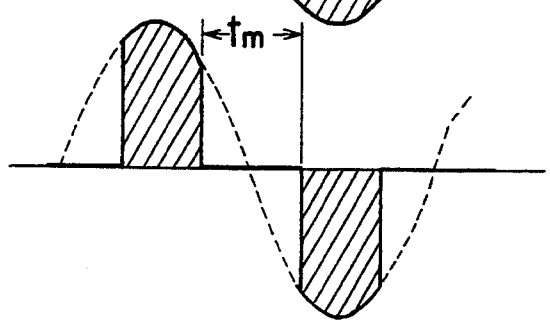
Figure 5:
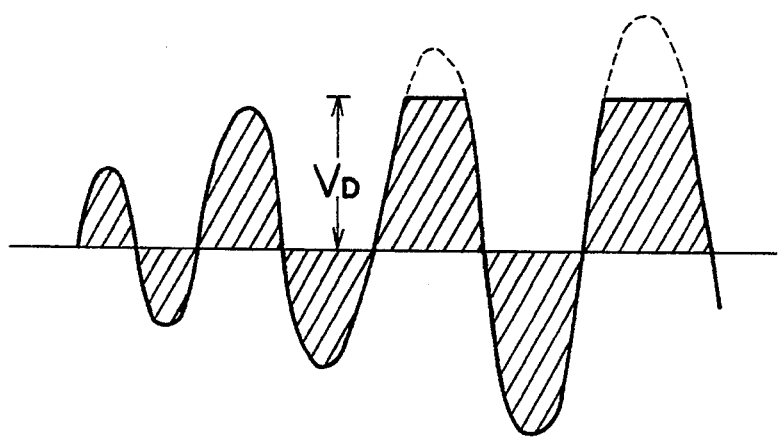
FIG. 5 is a diagram showing an alternative output waveform of the protective apparatus of FIG. 2 when muting is effective.

FIGS. 4 and 5 show output waveforms of the power transistor $Q_{10}$ when the muting circuit operates. A curve (b) of FIG. 4 shows an output waveform when the junction temperature of the power transistor $Q_{10}$ is higher than that of another curve (a) of FIG. 4, and it can be seen from FIG. 4 that the time $t_m$ during which muting is effective is controlled such that it is longer in the case shown by the curve (b) in FIG. 4 so that a rise of the junction temperature may be restricted. On the other hand, in the case shown in FIG. 5, the bias voltage to the power transistor $Q_{10}$ is controlled in accordance with a muting signal such that the output amplitude voltage of the power transistor $Q_{10}$ is limited so that it may not exceed a particular level $V_D$. In this manner, the output of the power transistor $Q_{10}$ will not be cut completely by application of muting. Naturally, when the environment in which the protective apparatus is used is in an abnormally high temperature condition, the output of the power transistor $Q_{10}$ may be cut completely. In the latter case wherein the bias voltage is controlled, the distortion feeling will be strong at a portion at which the audible feeling is strong, but in the former case, the distortion feeling is weaker.

Figure 6:
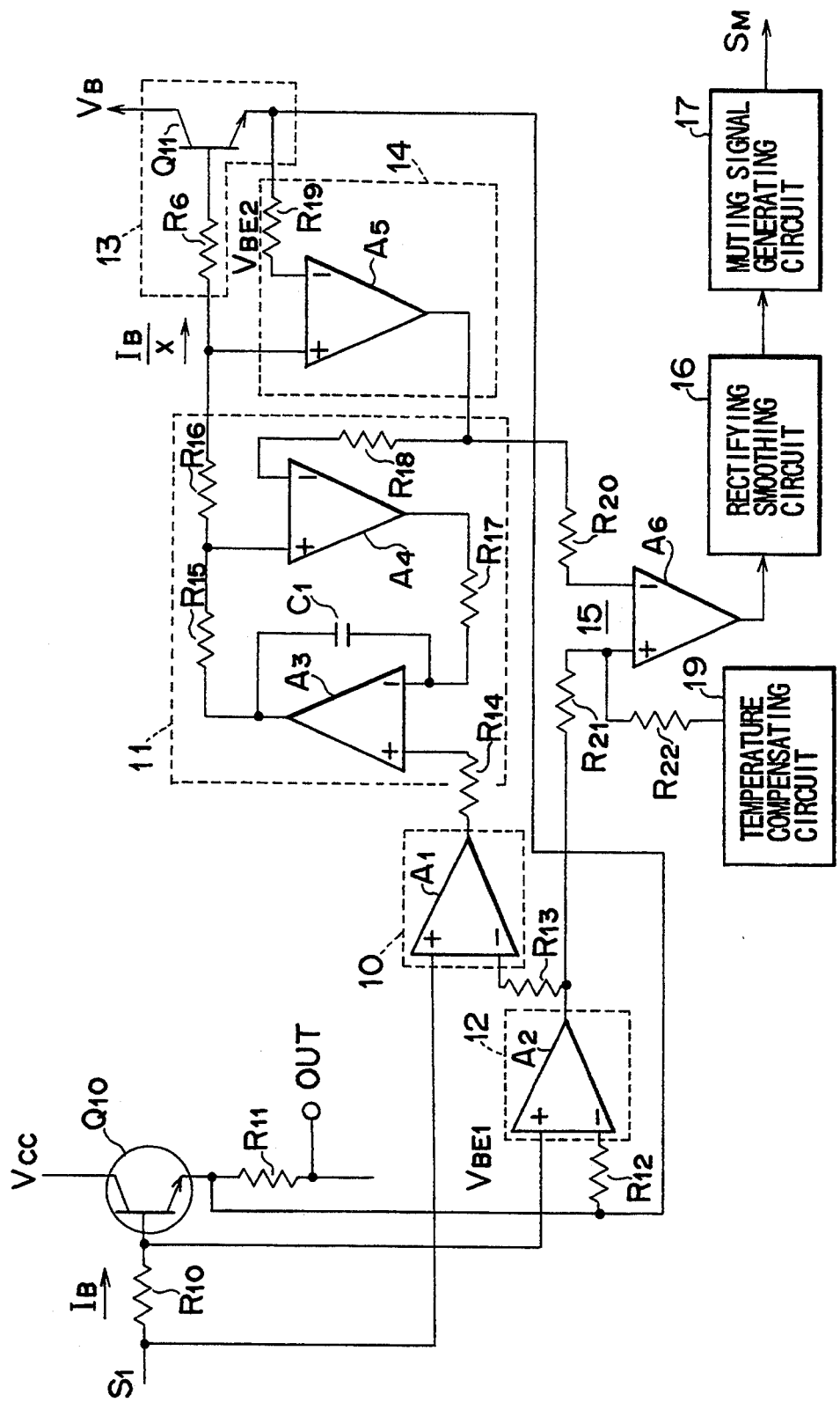
FIG. 6 is a block diagram of a further protective apparatus for a power transistor showing a third preferred embodiment of the present invention.

Referring now to FIG. 6, there is a further protective apparatus for a power transistor according to the present invention. The protective apparatus shown includes a base resistor $R_{10}$ connected to the base of a power transistor $Q_{10}$ and an emitter resistor $R_{11}$ connected to the emitter of the power transistor $Q_{10}$. An output of the power transistor $Q_{10}$ is extracted from the other end of the resistor $R_{11}$ remote from the power transistor $Q_{10}$. The other end of the base resistor $R_{10}$ remote from the power transistor $Q_{10}$ is connected to a non-negated input terminal of an amplifier circuit $A_1$, and the base of the power transistor $Q_{10}$ is connected to a non-negated input terminal of another amplifier circuit $A_2$. The emitter of the power transistor $Q_{10}$ is connected to a negated input terminal of the amplifier $A_2$ by way of a resistor $R_{12}$, and an output terminal of the amplifier circuit $A_2$ is connected to a negated input terminal of the amplifier circuit $A_1$ by way of another resistor $R_{13}$. The amplifier circuits $A_1$ and $A_2$ form a base current detecting circuit 10 and a base-emitter voltage detecting circuit 12, respectively.

An output terminal of the amplifier circuit $A_1$ is connected to a voltage to current converting circuit 11 by way of a resistor $R_{14}$. The voltage to current converting circuit 11 includes an amplifier circuit $A_3$, a capacitor $C_1$ connected between a negative input terminal and an output terminal of the amplifier circuit $A_3$, and a resistor $R_{15}$ connected to the output terminal of the amplifier circuit $A_3$ and connected at the other end thereof to another resistor $R_{16}$ and a non-negative input terminal of another amplifier circuit $A_4$. An output terminal of the amplifier circuit $A_4$ is connected to a negative input terminal of the amplifier circuit $A_3$ by way of a resistor $R_{17}$ such that an electric current equal to $1/X$ times the base current $I_B$ to the power transistor $Q_{10}$ may be supplied to a reference circuit 13 by way of the resistor $R_{16}$.

An amplifier circuit $A_5$ constitutes a reference base-emitter voltage detecting circuit 14, and a non-negative input terminal thereof is connected to a connecting point between the resistor $R_{16}$ and a base resistor Rb to a reference transistor $Q_{11}$ and a negative input terminal thereof is connected to the emitter of the reference transistor $Q_{11}$ by way of a resistor $R_{19}$. An output terminal of the amplifier circuit $A_5$ is connected to a negative input terminal of the amplifier circuit $A_4$ by way of a resistor $R_{18}$ and also to a resistor $R_{20}$. The emitter of the reference transistor $Q_{11}$ is connected to the emitter of the power transistor $Q_{10}$. The output terminal of the amplifier circuit $A_5$ is connected to a negative input terminal of a differential amplifier circuit $A_6$ by way of the resistor $R_{20}$, and the output terminal of the amplifier circuit $A_2$ is connected to a non-negative input terminal of the amplifier circuit $A_6$ by way of a resistor $R_{21}$. Meanwhile, a resistor $R_{22}$ is connected to the non-negative input terminal of the differential amplifier circuit $A_6$, and a temperature compensating circuit 19 having a positive temperature characteristic is connected to the other end of the resistor $R_{22}$. An output terminal of the differential amplifier circuit $A_6$ is connected to a rectifying smoothing circuit 16, which has an output terminal connected to a muting signal generating circuit 17.

An error voltage obtained from the differential amplifier circuit $A_6$ indicates a difference between the emitter-base voltages $V_{BE}$ of the power transistor $Q_{10}$ and the reference transistor $Q_{11}$ and corresponds to a difference $\Delta Tj$ between the junction temperatures of the transistors $Q_{10}$ and $Q_{11}$. The junction temperature difference $\Delta Tj$ thus corresponds to a base-emitter junction temperature Tj of the power transistor $Q_{10}$. A dc output of the rectifying smoothing circuit 16 is supplied to the muting signal generating circuit 17, and if the dc output is higher than a predetermined level, then the muting signal 17 supplies a muting signal $S_M$ to a muting circuit not shown (corresponding to the muting circuit 18 shown in FIG. 18) to cut the input signal $S_1$. Or else, apparently the bias voltage to the power transistor $Q_{10}$ may be controlled, in response to the muting signal $S_M$, to prevent an overload condition.

Figure 7:
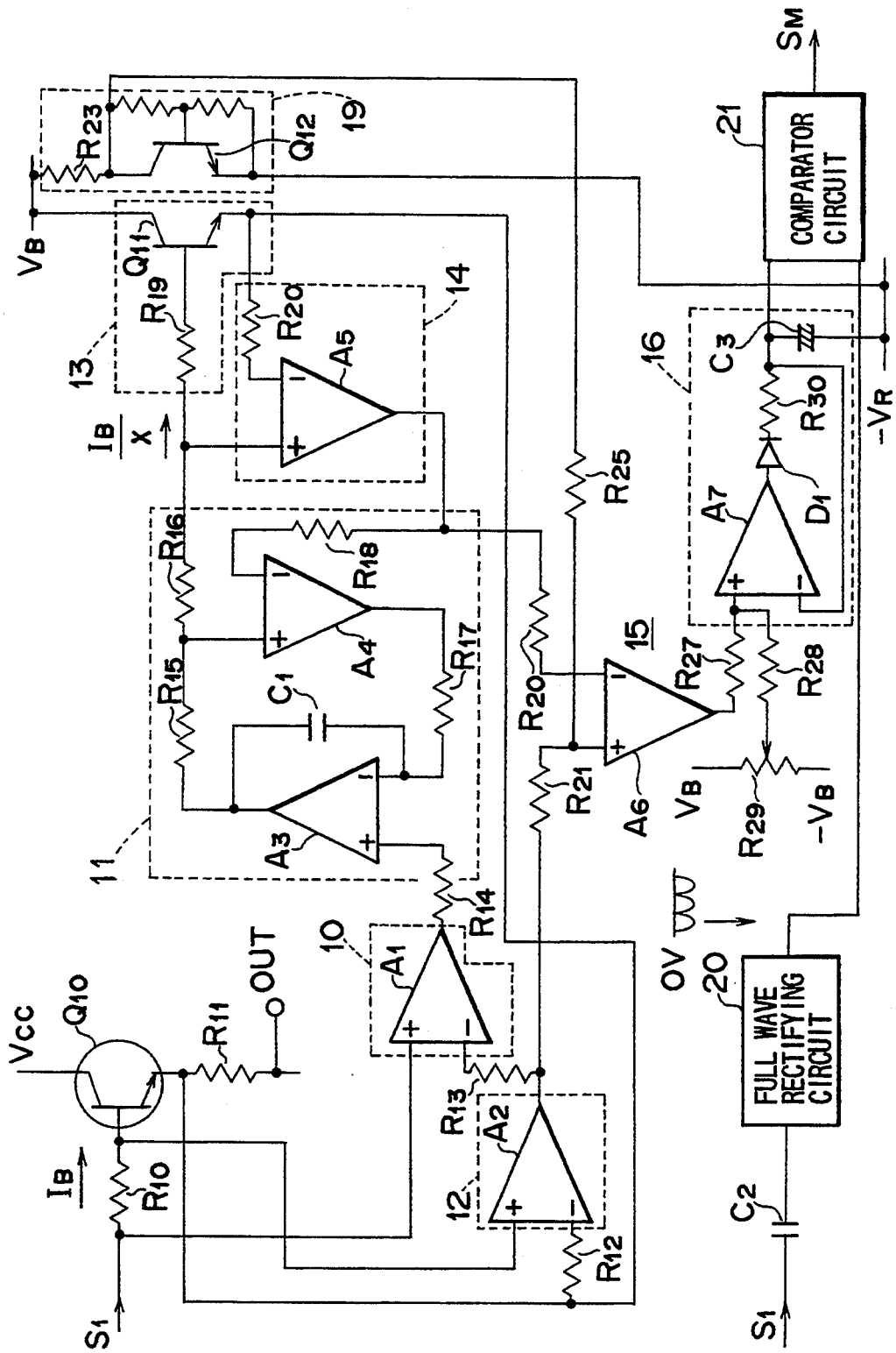
FIG. 7 is a block diagram of a developed modification to the protective apparatus for a power transistor shown in FIG. 6.
Figure 8A:
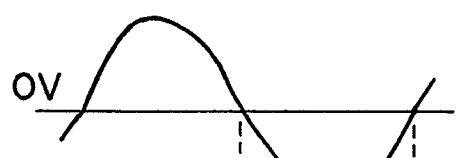
FIG. 8a–e is a diagram illustrating operation of the protective apparatus of FIG. 7.
Figure 8B:
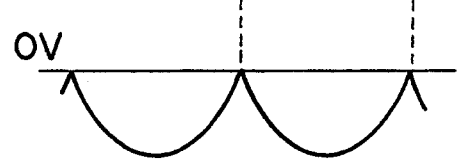
Figure 8C:
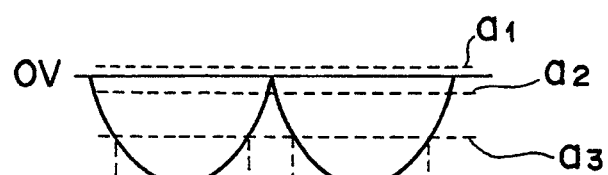
Figure 8D:
Figure 8E:
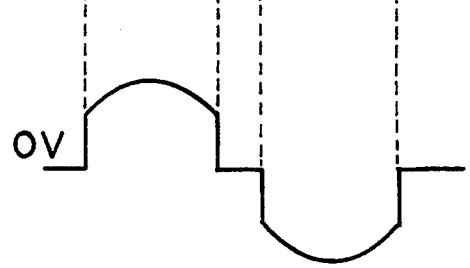

Referring now to FIG. 7, there is shown a modification to the protective apparatus for a power transistor shown in FIG. 6. Here, description will be given only of different features of the modified protective apparatus from those of the protective apparatus of FIG. 6. The temperature compensating circuit 19 is constituted from a transistor $Q_{12}$ disposed in the proximity of the reference transistor $Q_{11}$, a pair of resistors connected between the collector and the base and between the base and emitter of the transistor $Q_{12}$, and a further resistor $R_{23}$ connected to the collector of the transistor $Q_{12}$ and has a positive temperature characteristic. A connecting point between the resistor $R_{23}$ and the collector of the transistor $Q_{12}$ is connected to a non-negative input terminal of the differential amplifier $A_6$ so as to effect temperature compensation for the reference circuit 13. The output terminal $A_6$ of the differential amplifier circuit $A_6$ is connected to a non-negative input terminal of a differential amplifier circuit $A_7$ of the self-excitation type by way of a resistor $R_{27}$, and also another resistor $R_{28}$ is connected to the non-negated input terminal of the differential amplifier circuit $A_7$. The other end of the resistor $R_{28}$ is connected to a center tap of a variable resistor $R_{29}$ connected between voltage sources $V_B$ and $-V_B$. The anode of a diode $D_1$ is connected to an output terminal of the differential amplifier circuit $A_7$, and the cathode of the diode $D_1$ is connected to a resistor $R_{30}$. The other end of the resistor $R_{30}$ is connected to a capacitor $C_3$ and also to a comparator circuit 21 which generates a muting signal $S_M$. The other end of the capacitor $C_3$ and the temperature compensating circuit 19 are connected to a negative voltage source $-V_R$. An input signal $S_1$, which is supplied to the power transistor $Q_{10}$ by way of the base resistor 10, is also supplied to a full wave rectifier circuit 20, an output of which is supplied to the other input terminal of the comparator circuit 21.

A muting operation of the protective apparatus of FIG. 7 will be described with reference to FIGS. 7 and 8. A curve (a) of FIG. 8 shows a waveform of the input signal $S_1$, and a waveform of the input signal $S_1$ after it is rectified by the full wave rectifier circuit 20 is shown by a curve (b) of FIG. 8. An output of the full wave rectifier circuit 20 is supplied to one of the two input terminals of the comparator circuit 21, and a dc voltage corresponding to a junction temperature Tj of the power transistor $Q_{10}$ is supplied to the other input terminal of the comparator circuit 21 by way of the rectifying smoothing circuit 16. In a regular operating condition, the level of the dc voltage supplied to the comparator circuit 21 is higher than the zero level as seen from a broken line $a_1$ of a curve (c) of FIG. 8, and if the junction temperature of the power transistor $Q_{10}$ rises, then the dc level drops gradually until it comes across the zero level to a negative dc level $a_2$. Then, if the temperature rises further, the dc level further drops to a further lower dc level $a_3$. If the dc level of the rectifying smoothing circuit 20 is equal to the level $a_3$, then a muting signal having such a waveform as seen from a curve (d) of FIG. 8 is generated from the comparator circuit 21. The output waveform of the power transistor $Q_{10}$ then is such as indicated by a curve (e) of FIG. 8. The reason why a peak waveform of the output signal is held while muting is applied to a small signal portion is that it is intended to output a portion which is audible so that a feeling of anxiety which may otherwise be caused by by a complete muting operation may be reduced as far as possible.

Figure 9:
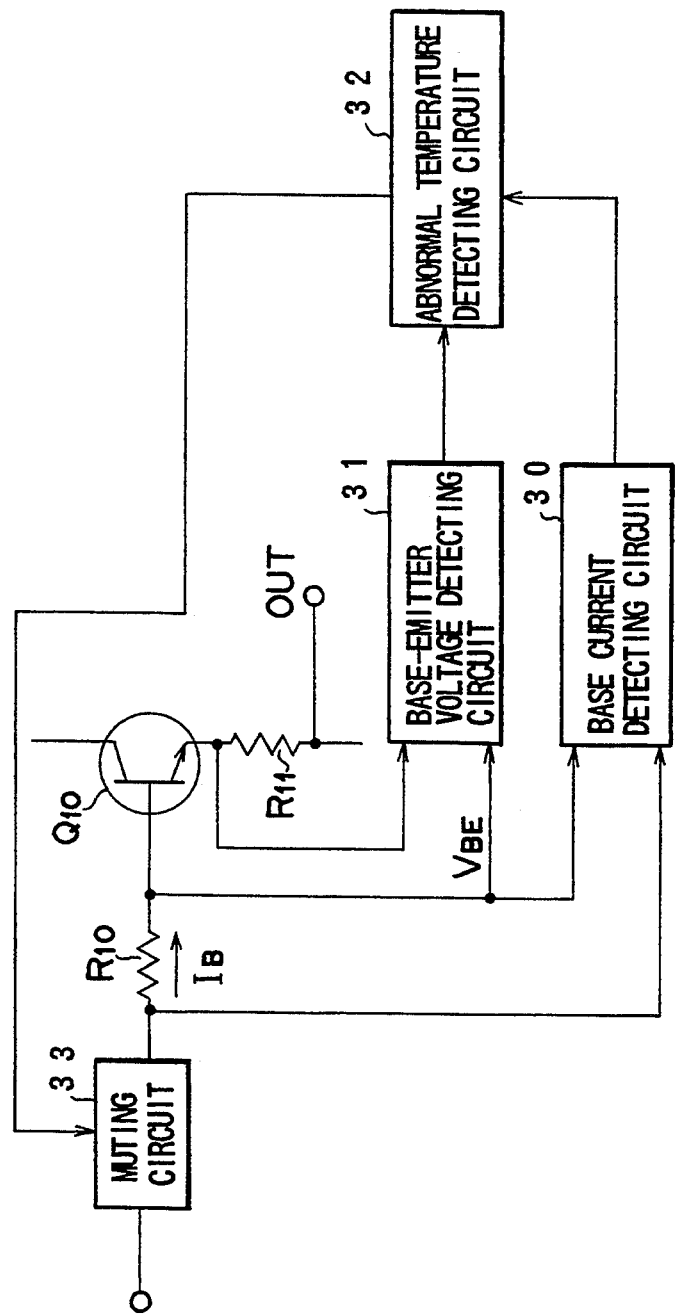
FIG. 9 is a block diagram of a still further protective apparatus for a power transistor showing a fourth preferred embodiment of the present invention.

Referring now to FIG. 9, there is shown a yet further protective apparatus for a power transistor according to the present invention. The protective apparatus, shown includes a power transistor $Q_{10}$, a base resistor $R_{10}$, an emitter resistor $R_{11}$, a base current detecting circuit 30 for detecting a base current $I_B$ from a voltage across the resistor $R_{10}$, a base-emitter detecting circuit 31 for detecting a base-emitter voltage $V_{BE}$ of the power transistor $R_{10}$, an abnormal temperature detecting circuit 32 for detecting an abnormally high condition of a junction temperature Tj of the power transistor $Q_{10}$, and a muting circuit 33 for cutting an input signal to the power transistor $Q_{10}$ in response to a signal from the abnormal temperature detecting circuit 32. An output of the power transistor $Q_{10}$ is extracted from the other end of the resistor $R_{11}$ remote from the power transistor $Q_{10}$.

Figure 10:
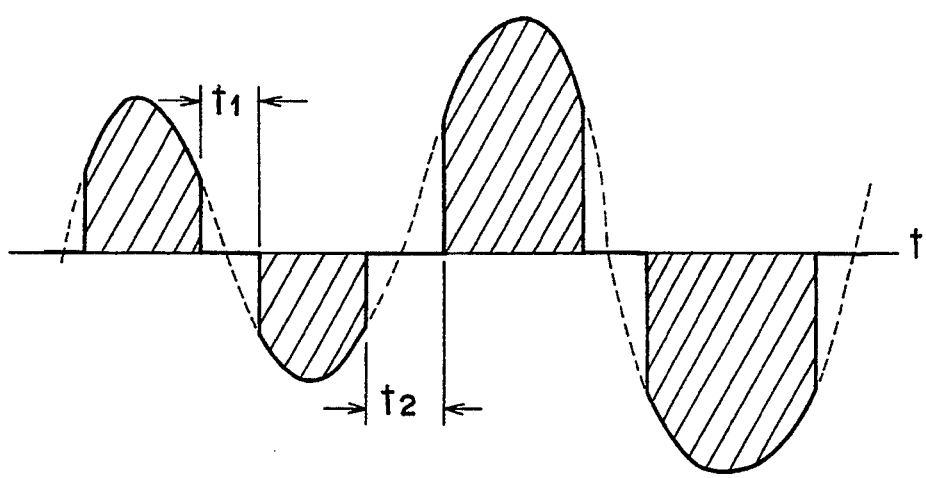
FIG. 10 is a waveform diagram illustrating a muting operation of the protective apparatus of FIG. 9.

The protective apparatus for a power transistor of the present embodiment detects a predetermined base current of the power transistor, detects an abnormal junction temperature at which the power transistor may be put into breakdown by the base-emitter voltage $V_{BE}$ then and applies muting to an input signal to the power transistor. The base current $I_B$ is detected from a voltage across the base resistor $R_{10}$, and the voltage across the base resistor $R_{10}$ is supplied to the base current detecting circuit 30 which may be constituted from an amplifier circuit, a comparator circuit or the like. When the output voltage of the base current detecting circuit 30 which corresponds to the voltage across the base resistor $R_{10}$ is higher than a reference voltage $V_{R1}$, it is judged that the base current $I_B$ is higher than a preset current value, and a detection signal is supplied to the abnormal temperature detecting circuit 32 which may be constituted from a gate circuit or the like. An output voltage of the base-emitter voltage detecting circuit 31 is sampled by the abnormal temperature detecting circuit 32 in response to the detection signal from the base current-detecting, circuit 30. In case it is detected that the base-emitter voltage $V_{BE}$ of the power transistor $Q_{10}$ is lower than a predetermined level, it is judged that the junction temperature Tj of the power transistor $Q_{10}$ is in a dangerous condition, and a muting signal is supplied from the abnormal temperature detecting circuit 32 to the muting circuit 33 to cut the input signal to the power transistor $Q_{10}$ to prevent an excessive current from flowing through the power transistor $Q_{10}$ thereby to prevent thermal runaway of the power transistor $Q_{10}$. The muting circuit 33 operates intermittently for a short period of time as seen from an output waveform of an audio frequency power amplifier circuit in FIG. 10, in which $t_1$ and $t_2$ denote muting periods of time. Thermal runaway of the power transistor $Q_{10}$ is prevented without cutting the output completely in this manner. Naturally, as the junction temperature of the power transistor $Q_{10}$ rises, the muting time is increased.

Figure 11:
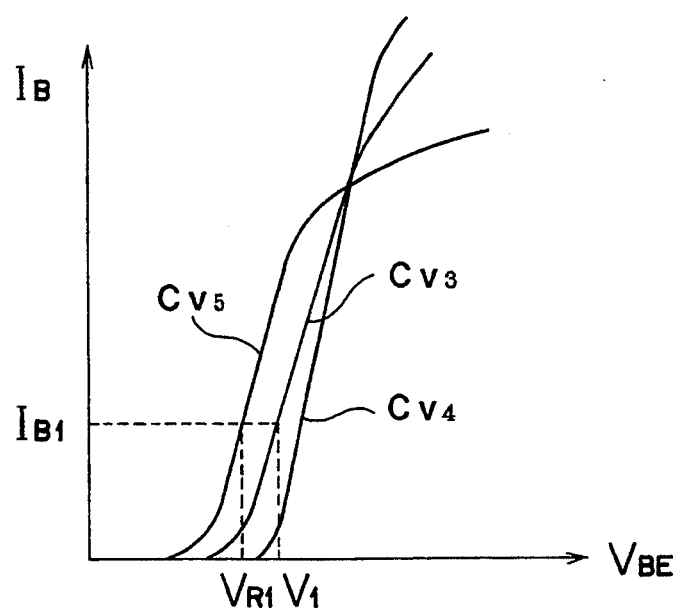
FIG. 11 is a waveform diagram illustrating a principle of operation of the protective apparatus of FIG. 9.

As is well known in the art, the base-emitter voltage $V_{BE}$ of a transistor has a temperature characteristic of $-2$ mV/° C. In case the voltage-current characteristic when the temperature of the element is 25 ° C. is such as shown by a curve $C_{V3}$ in FIG. 11, when the temperature of the element drops below 25° C., then the base-emitter voltage of the element rises and consequently the voltage-current characteristic of the element then is such as shown by another curve $C_{V4}$ in FIG. 11. On the contrary when the temperature of the element rises above 25° C., then the base-emitter voltage of the element drops and consequently the voltage-current characteristic of the element then is such as shown by a further curve $C_{V5}$ in FIG. 11. Making use of such temperature characteristic of the base-emitter voltage of a transistor, a junction temperature Tj of a power transistor is detected from a base-emitter voltage $V_{BE}$ of the power transistor when the base current $I_B$ has a predetermined value ($I_{B1}$).

Figure 12:
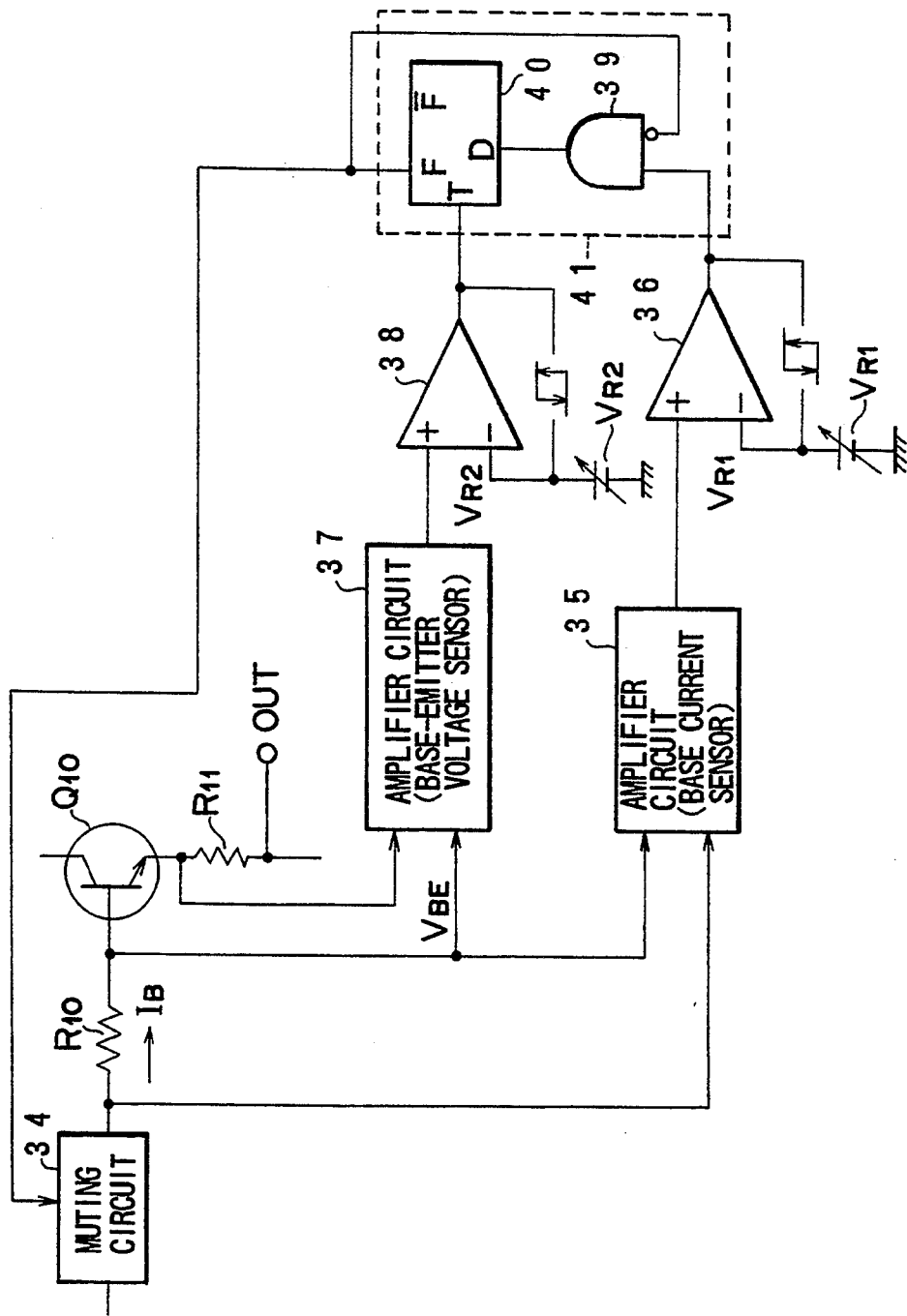
FIG. 12 is a block diagram of a yet further protective apparatus for a power transistor showing a fifth preferred embodiment of the present invention.

Referring now to FIG. 12, there is shown a yet further protective apparatus for a power transistor according to the present invention. The protective apparatus shown includes an amplifier circuit or base current sensor 35 for amplifying a voltage across a resistor $R_{10}$ corresponding to a base current $I_B$ of a power transistor $Q_{10}$, and a comparator 36 to which a reference voltage $V_{R1}$ for detecting a base current $I_{B1}$ which makes a reference upon detection of a junction temperature of the power transistor $Q_{10}$ is applied and which has a hysteresis characteristic, another amplifier circuit or base-emitter voltage sensor 37 for amplifying a base-emitter voltage $V_{BE}$ of the power transistor $Q_{10}$, another comparator 38 to which another reference voltage $V_{R2}$ is applied and which has a hysteresis characteristic, and an abnormal temperature detecting circuit 41 constituted from a gate circuit including an AND circuit 89 and a delay-type flipflop 40. The reference voltage $V_{R2}$ applied to the comparator 38 is an allowable highest temperature for the junction of the power transistor $Q_{10}$ and is set to a value of a base emitter voltage when the base current to the power transistor $Q_{10}$ is equal to the reference base current $I_B$, that is, a base-emitter voltage value at which the junction can evade breakdown by thermal runaway. An output of the power transistor $Q_{10}$ is extracted from the other end of the resistor $R_{11}$ remote from the power transistor $Q_{11}$.

In the protective apparatus shown in FIG. 12, a voltage across the base resistor $R_{10}$ is amplified by the amplifier circuit 35, and an output voltage of the amplifier circuit 35 is compared with the reference voltage $V_{R1}$ by the comparator 36. When the comparator 36 detects that the base current to the power transistor $Q_{10}$ is equal to the predetermined base current $I_{B1}$, it applies a "H" signal to the AND circuit 39. Since a "L" signal is applied then to the other negated input terminal of the AND circuit 39, a "H" signal is applied to the D terminal of the delay-type flipflop 20. Meanwhile, a base-emitter voltage $V_{BE}$ of the power transistor $Q_1$ e is amplified by the amplifier circuit 37, and an output of the amplifier circuit 37 is compared with the reference voltage $V_{R2}$ by the comparator 38. Thus, when the base-emitter voltage of the power transistor $Q_{10}$ is lower than the reference voltage $V_{R2}$, a "H" signal is applied from the comparator 38 to the T terminal of the delay-type flipflop 20. Consequently, the F terminal of the delay-type flipflop 20 is changed over from a "L" level to a "H" level, and consequently, an abnormal temperature detection signal is supplied from the abnormal temperature detecting circuit 41 to the muting circuit 34. Consequently, muting is applied from the muting circuit 34 to the input signal to the power transistor $Q_{10}$ thereby to cut the load to the power transistor $Q_{10}$, and consequently, the power transistor $Q_{10}$ is released from abnormal heat generation.

Figure 13:
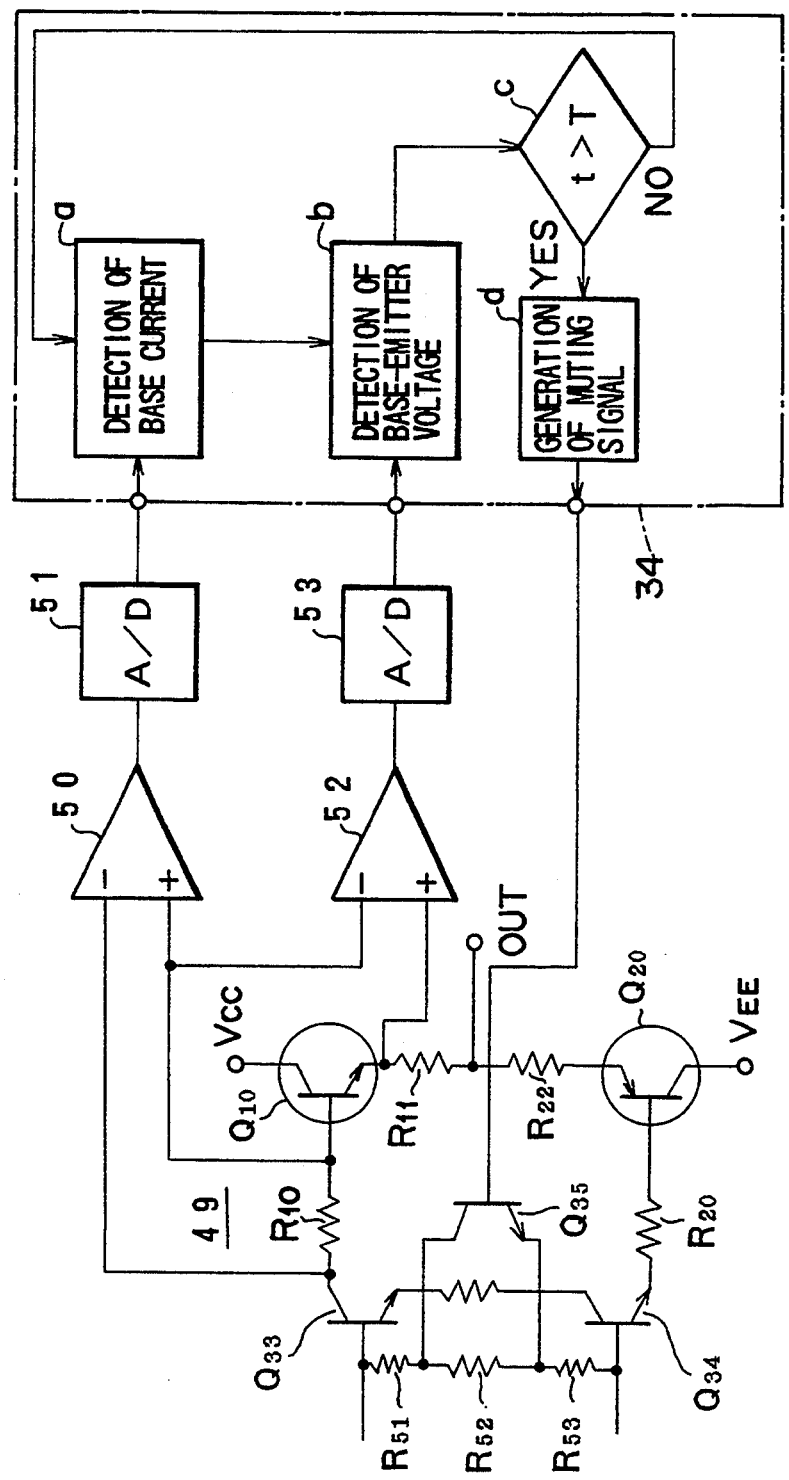
FIG. 13 is a block diagram of a yet further protective apparatus for a power transistor showing a sixth preferred embodiment of the present invention.
Figure 14:
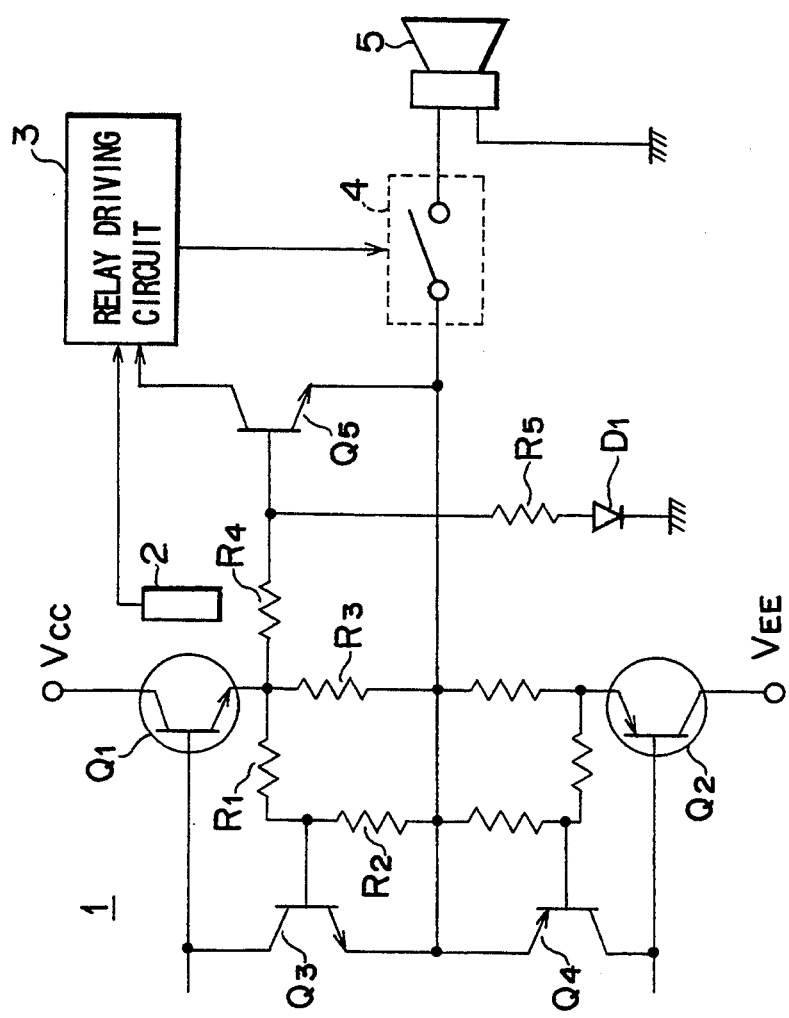
FIG. 14 is a circuit diagram showing a conventional protective apparatus for a power transistor.

Referring now to FIG. 13, there is shown a yet further protective apparatus for a power transistor according to the present invention. In the present protective apparatus, judgment from a base-emitter voltage of a power transistor whether or not the junction temperature Tj of the power transistor is at an abnormal level is performed by a signal processing circuit such as a central processing unit (CPU).

In particular, an audio frequency power amplifier circuit 49 includes a pair of power transistors $Q_{10}$ and $Q_{20}$ at an output stage thereof. A series circuit of resistors $R_{11}$ and $R_{22}$ is connected between the emitters of the power transistors $Q_{10}$ and $Q_{20}$, and an output of the power transistor $Q_{10}$, that is, an output of the audio frequency power amplifier circuit 49, is extracted from a connecting point between the resistors $R_{11}$ and $R_{22}$. Another series circuit of resistors $R_{51}$, $R_{52}$ and $R_{53}$ are connected between the bases of a pair of transistors $Q_{33}$ and $Q_{34}$. The audio frequency power amplifier circuit 49 further includes base resistor $R_{10}$ and $R_{20}$ connected to the bases of the power transistors $Q_{10}$ and $Q_{20}$, respectively. The protective apparatus includes an error amplifier 50 connected at input terminals thereof to the opposite ends of the base resistor $R_{10}$ and another error amplifier 52 connected at input terminals thereof to the base and the emitter of the power transistor $Q_{10}$. The protective apparatus further includes a pair of analog to digital (A/D) converters 51 and 58 connected to output terminals of the error amplifiers 50 and 52, respectively, and a signal processing circuit 54 such as a CPU connected to output terminals of the A/D converters 51 and 53. Thus, digital signals are supplied from the A/D converters 51 and 53 to the signal processing circuit 54, at which signal processing operations are performed through steps a to e.

In particular, at step a, the signal processing circuit 54 detects whether or not the digital signal received from the A/D converter 51 is equal to or higher than a reference value corresponding to a preset base current $I_{B1}$. If the signal processing circuit 54 detects that the digital signal from the A/D converter 51 is equal to or higher than the reference value, then the signal processing circuit 54 samples, at step b, a signal supplied from the other A/D converter 53. Then at step c, the sample value t obtained at step b, which represents a base-emitter voltage of the power transistor $Q_{10}$ corresponding to a junction temperature Tj of the power transistor then after conversion into a digital signal, is compared with a predetermined value T which corresponds to an abnormal junction temperature of the power transistor $Q_{10}$ at which muting must be applied and represents a base-emitter voltage of the power transistor $Q_{10}$ corresponding to such abnormal junction temperature after conversion into a digital value. Then, if $t > T$ is judged at step c, then a muting signal is applied, at step d, from the signal processing circuit 54 to the base of a transistor $Q_{35}$ of the audio frequency power amplifier circuit 49, whereupon the opposite ends of the resistor $R_{52}$ are short-circuited. Consequently, the base current to the power transistor $Q_{10}$ is restricted, thereby protecting the power transistor $Q_{10}$ from breakdown by thermal runaway. On the other hand, if $t \leq T$ is judged at step c, then the signal processing by the signal processing circuit 54 returns to the first step a to repeat such processing operations as described above.

Having now fully described the invention, it will be apparent to one of ordinary skill in the art that many changes and modifications can be made thereto without departing from the spirit and scope of the invention as set forth herein.

What is claimed is:

1. A protective apparatus for a power transistor, comprising:
   a detecting circuit for directly detecting a base-emitter voltage of said power transistor;
   a protective circuit for producing an output signal when an output voltage of said detecting circuit is lower than a predetermined level; and
   a muting circuit for muting an input signal to said power transistor in response to the output signal of said protective circuit.

2. A protective apparatus for a power transistor, comprising:
   a detecting circuit for directly detecting a base-emitter voltage of said power transistor;
   a protective circuit for producing an output signal when an output voltage of said detecting circuit is lower than a predetermined level; and
   a muting circuit for limiting a current flow through said power transistor in response to the output signal of said protective circuit.

3. A protective apparatus for a power transistor, comprising:
   detecting means for directly detecting a base-emitter voltage of said power transistor;
   current producing means for producing a current corresponding to a base current to said power transistor;
   reference means including a reference transistor to which the output current of said current producing means is supplied;
   comparing means for comparing an output of said detecting means with an output of said reference means; and
   limiting means for limiting the base current to said power transistor in response to an output of said comparing means.

4. A protective apparatus for a power transistor as claimed in claim 3, wherein said reference means further includes reference base-emitter voltage detecting means connected between the output of said current producing means and the emitter of said reference transistor for detecting a reference base-emitter voltage of said reference transistor which is to be compared by said comparing means.

5. A protective apparatus for a power transistor as claimed in claim 3, wherein said reference means further includes a resistor connected between the output of said current producing means and the base of said reference transistor and having a resistance corresponding to an internal resistance of said power transistor, and reference base-emitter voltage detecting means connected between the output of said current producing means and the emitter of said reference transistor for detecting a reference base-emitter voltage of said reference transistor which is to be compared by said comparing means.

6. A protective apparatus for a power transistor as claimed in claim 3, wherein said current producing means produces a current which is equal to 1/X times the base current to said power transistor, X being a positive value greater than 1.

7. A protective apparatus for a power transistor as claimed in claim 6, wherein said current producing means includes a base current detecting circuit for detecting a voltage across a resistor connected to the base of said power transistor such that the base current may be supplied to said power transistor by way of said resistor, and a voltage-current converting circuit for converting an output of said base current detecting circuit into a current signal.

8. A protective apparatus for a power transistor as claimed in claim 7, wherein said detecting means includes a first amplifier having a pair of input terminals connected to the base and the emitter of said power transistor, and said base current detecting circuit includes a second amplifier an input terminal of which is connected to the end of said resistor remote from said power transistor and the other input terminal of which is connected to an output terminal of said first amplifier.

9. A protective apparatus for a power transistor as claimed in claim 3, further comprising a temperature compensating circuit for generating a voltage corresponding to a temperature of a junction of said reference transistor of said reference means to eliminate an influence of an ambient temperature upon comparison at said comparing means.

10. A protective apparatus for a power transistor as claimed in claim 3, wherein said comparing means includes a differential amplifier having a pair of input terminals connected to said detecting means and said reference means.

11. A protective apparatus for a power transistor as claimed in claim 3, wherein said limiting means includes a rectifying smoothing circuit connected to said comparing means, a full wave rectifier circuit for receiving an input signal which is to be inputted to said power transistor, a comparator for comparing outputs of said rectifying smoothing circuit and said full wave rectifier circuit with each other to produce a muting signal, and a muting circuit for muting the input signal to said power transistor in response to the muting signal from said comparator.

12. A protective apparatus for a power transistor, comprising:
- detecting means for directly detecting a base-emitter voltage of said power transistor;
- current producing means for producing a current corresponding to a base current to said power transistor;
- reference means including a reference transistor to which the output current of said current producing means is supplied;
- comparing means for comparing an output of said detecting means with an output of said reference means; and
- limiting means for limiting a current flow through said power transistor in response to an output of said comparing means.

13. A protective apparatus for a power transistor, comprising:
- first detecting means for directly detecting that the base current to said power transistor is equal to a first predetermined value;
- second detecting means for detecting a base-emitter voltage of said power transistor;
- third detecting means operable in response to a detection signal from said first detecting means for detecting that a voltage value obtained from said second detecting means is lower than a second predetermined value; and
- means for controlling an input signal to said power transistor in response to a detection signal from said third detecting means.

14. A protective apparatus for a power transistor as claimed in claim 13, wherein each of said first and second detecting means includes an analog to digital converter and outputs a digital signal, and said third detecting means operates digitally in response to the digital output signals of said first and second means.

15. A protective apparatus for a power transistor as claimed in claim 13, wherein said first detecting means detects a base current to said power transistor from a voltage across a resistor connected to the base of said power transistor such that the base current may be supplied to said power transistor by way of said resistor.

16. A protective apparatus for a power transistor as claimed in claim 15, wherein said third detecting means is an abnormal temperature detecting circuit which includes an AND circuit having an input terminal connected to said first comparator, and a delay-type flipflop having the D terminal connected to an output terminal of said AND circuit and the T terminal connected to said second comparator, an output terminal of said delay-type flipflop being connected to the other input terminal of said AND circuit.

17. A protective apparatus for a power transistor, comprising:
- a first amplifier circuit for producing an output corresponding to a base current of said power transistor:
- a first comparator for comparing the output of said first amplifier circuit with a first predetermined reference level;
- a second amplifier circuit for amplifying a base-emitter voltage of said power transistor;
- a second comparator for comparing an output of said second amplifier circuit with a second predetermined reference level;
- an abnormal temperature detecting circuit for producing an abnormal temperature detection signal from outputs of said first and second comparators;
- controlling means for controlling an input signal to said power transistor in response to the abnormal temperature detection signal from said abnormal temperature detecting circuit.

18. A protective apparatus for a power transistor as claimed in claim 16, wherein said abnormal temperature detecting circuit includes an AND circuit having an input terminal connected to said first comparator, and a delay-type flipflop having the D terminal connected to an output terminal of said AND circuit and the T terminal connected to said second comparator, an output terminal of said delay-type flipflop being connected to the other input terminal of said AND circuit.

* * * * *